United States Patent
Kamijima et al.

(10) Patent No.: US 10,687,149 B2
(45) Date of Patent: Jun. 16, 2020

(54) MEMS MICROPHONE

(71) Applicant: TDK CORPORATION, Tokyo (JP)

(72) Inventors: Akifumi Kamijima, Tokyo (JP); Tohru Inoue, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/509,628

(22) Filed: Jul. 12, 2019

(65) Prior Publication Data

US 2020/0077201 A1    Mar. 5, 2020

(30) Foreign Application Priority Data

Aug. 30, 2018   (JP) .................................. 2018-161720

(51) Int. Cl.
| | | |
|---|---|---|
| H04R 19/04 | (2006.01) | |
| H04R 3/04 | (2006.01) | |
| H04R 3/00 | (2006.01) | |
| H04R 25/00 | (2006.01) | |
| B81B 7/00 | (2006.01) | |

(52) U.S. Cl.
CPC ............ *H04R 19/04* (2013.01); *B81B 7/008* (2013.01); *H04R 3/005* (2013.01); *H04R 3/04* (2013.01); *H04R 25/407* (2013.01); *B81B 2201/0257* (2013.01); *H04R 2201/003* (2013.01)

(58) Field of Classification Search
CPC .......... H04R 19/04; H04R 3/005; H04R 3/04; H04R 25/407; H04R 2201/003; B81B 7/008; B81B 2201/0257
See application file for complete search history.

(56) References Cited

U.S. PATENT DOCUMENTS

| | | |
|---|---|---|
| 6,654,468 B1 | 11/2003 | Thompson |
| 8,270,634 B2* | 9/2012 | Harney ................ H04R 1/245 381/113 |
| 8,934,649 B1* | 1/2015 | Lee .................... H04R 19/005 381/174 |
| 2003/0002129 A1 | 1/2003 | Kobayashi et al. |
| 2005/0246167 A1 | 11/2005 | Nakajima et al. |
| 2006/0280318 A1 | 12/2006 | Warren et al. |
| 2008/0192963 A1* | 8/2008 | Sato .................... H04R 19/005 381/174 |

(Continued)

FOREIGN PATENT DOCUMENTS

| | | |
|---|---|---|
| JP | 2001-169395 A | 6/2001 |
| JP | 2006-005710 A | 1/2006 |

(Continued)

*Primary Examiner* — David L Ton
(74) *Attorney, Agent, or Firm* — Oliff PLC

(57) ABSTRACT

A MEMS microphone includes a substrate, and a first conversion portion and a second conversion portion provided on the substrate, the first conversion portion and the second conversion portion convert sound into an electrical signal, the first conversion portion includes a first through hole, a first membrane covering the first through hole, and a first back plate facing the first membrane via a first air gap, the second conversion portion includes a second through hole, a second membrane covering the second through hole, and a second back plate facing the second membrane via a second air gap, and an area of the second membrane is 1.21 times or more and 2.25 times or less an area of the first membrane when viewed in a thickness direction of the substrate.

10 Claims, 13 Drawing Sheets

(56) References Cited

U.S. PATENT DOCUMENTS

| | | |
|---|---|---|
| 2008/0205668 A1 | 8/2008 | Torii et al. |
| 2009/0181489 A1 | 7/2009 | Horimoto et al. |
| 2010/0092020 A1 | 4/2010 | Ryan et al. |
| 2010/0183167 A1* | 7/2010 | Phelps .................. H04R 3/005 381/94.1 |
| 2012/0039499 A1 | 2/2012 | Ryan et al. |
| 2012/0123775 A1 | 5/2012 | Murgia et al. |
| 2012/0207334 A1 | 8/2012 | Ryan et al. |
| 2013/0096914 A1 | 4/2013 | Avendano et al. |
| 2013/0108074 A1* | 5/2013 | Reining ................. H04R 3/005 381/92 |
| 2015/0003638 A1 | 1/2015 | Kasai |
| 2015/0043759 A1 | 2/2015 | Koji et al. |
| 2015/0076627 A1 | 3/2015 | Johansen et al. |
| 2015/0078592 A1* | 3/2015 | Uchida .................. H04R 19/04 381/191 |
| 2015/0078593 A1* | 3/2015 | Uchida ............... H04R 19/005 381/191 |
| 2015/0104048 A1* | 4/2015 | Uchida .................. H04R 7/06 381/174 |
| 2015/0296306 A1* | 10/2015 | Shao .................. H04R 19/005 381/174 |
| 2016/0037266 A1* | 2/2016 | Uchida .................. H04R 7/06 381/71.8 |
| 2016/0277846 A1 | 9/2016 | Lee |
| 2016/0345106 A1 | 11/2016 | Pahl et al. |
| 2017/0223455 A1 | 8/2017 | Conklin et al. |
| 2017/0326591 A1 | 11/2017 | Apte et al. |
| 2017/0347174 A1 | 11/2017 | Chandrasekaran et al. |
| 2018/0234751 A1 | 8/2018 | Lee |
| 2018/0270587 A1* | 9/2018 | Lee ..................... H04R 19/005 |
| 2020/0077202 A1* | 3/2020 | Kamijima ............. H04R 19/04 |

FOREIGN PATENT DOCUMENTS

| | | |
|---|---|---|
| JP | 2007-104562 A | 4/2007 |
| JP | 2007-295487 A | 11/2007 |
| JP | 2008-245267 A | 10/2008 |
| JP | 2011-055087 A | 3/2011 |
| JP | 2012-506211 A | 3/2012 |
| JP | 2013-183164 A | 9/2013 |
| JP | 2015-502693 A | 1/2015 |
| JP | 2015-035730 A | 2/2015 |
| JP | 2017-509195 A | 3/2017 |
| WO | 2004/021031 A1 | 3/2004 |

* cited by examiner

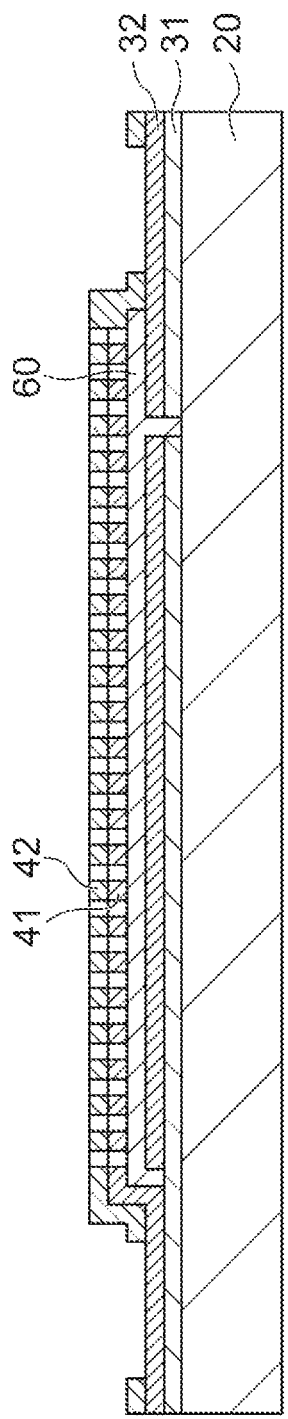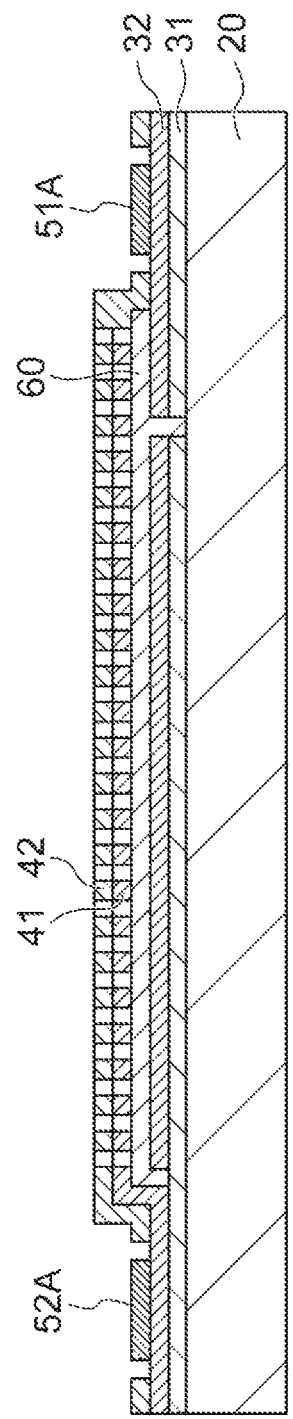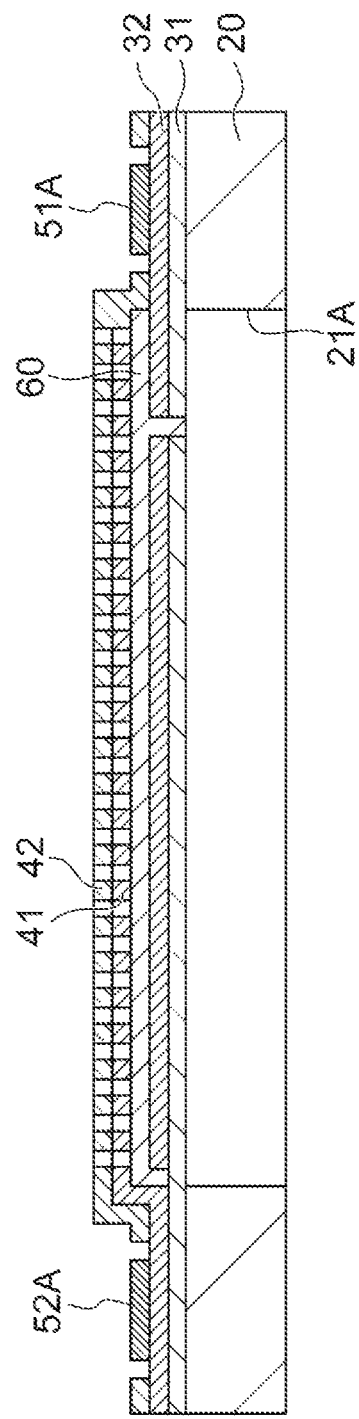

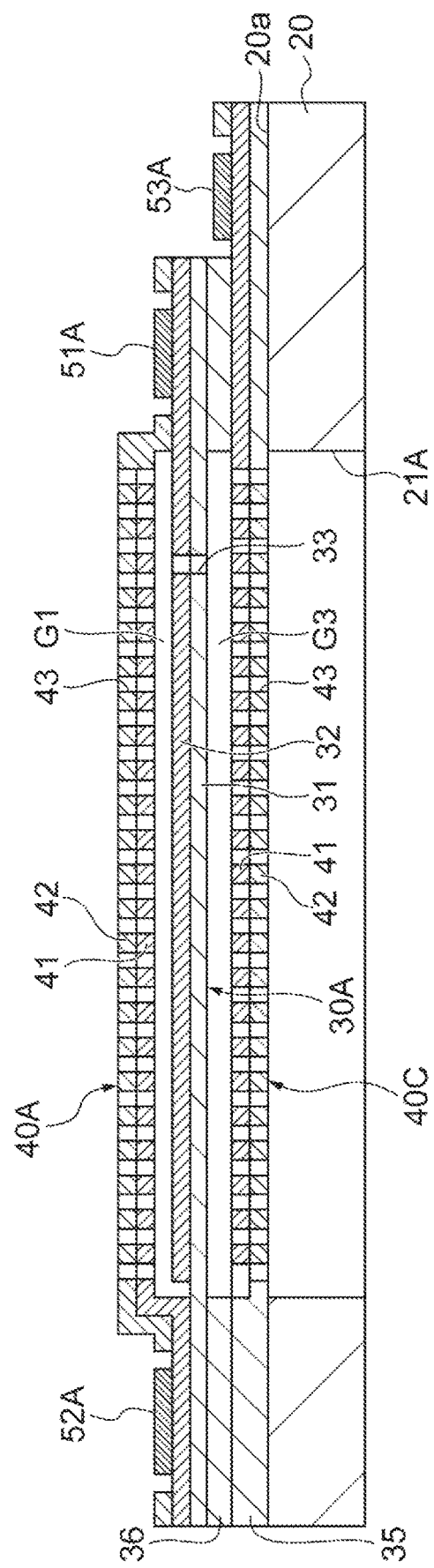

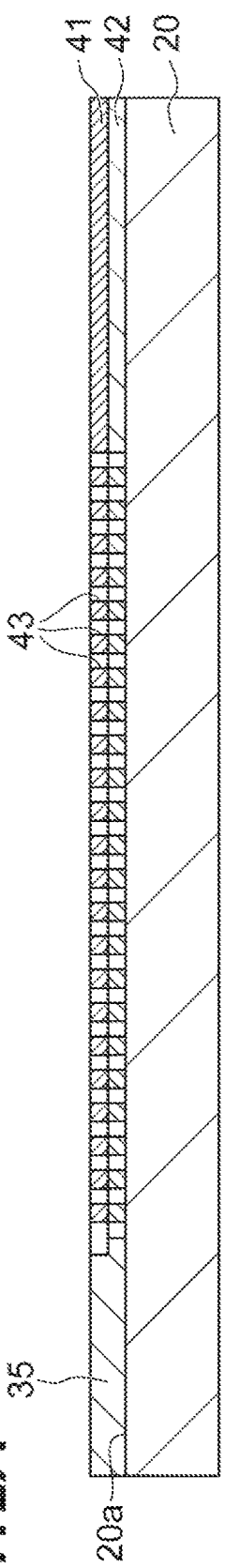
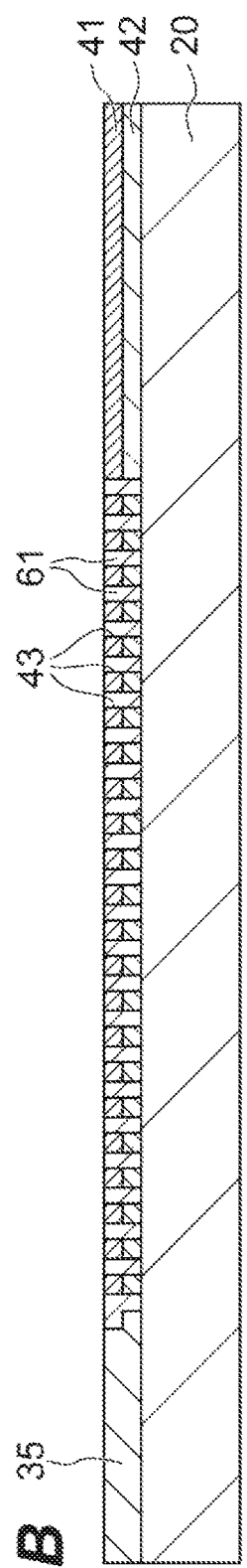
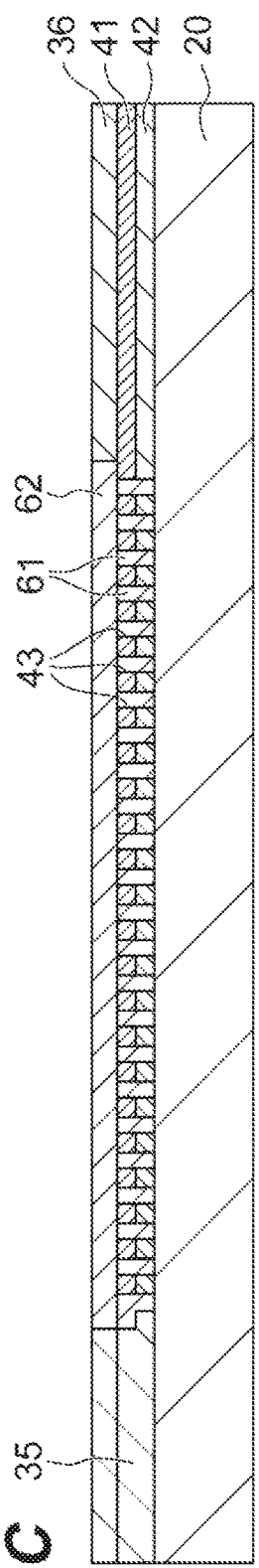

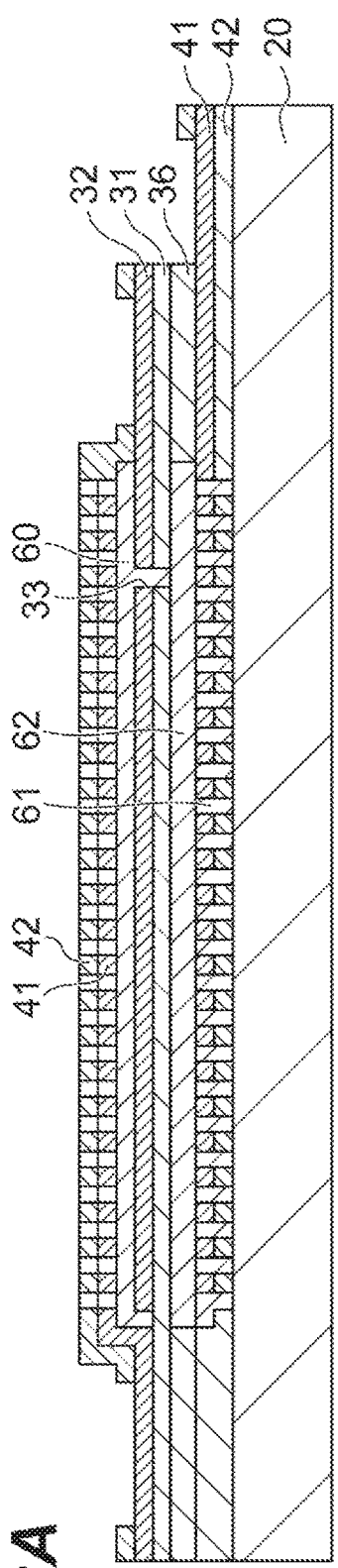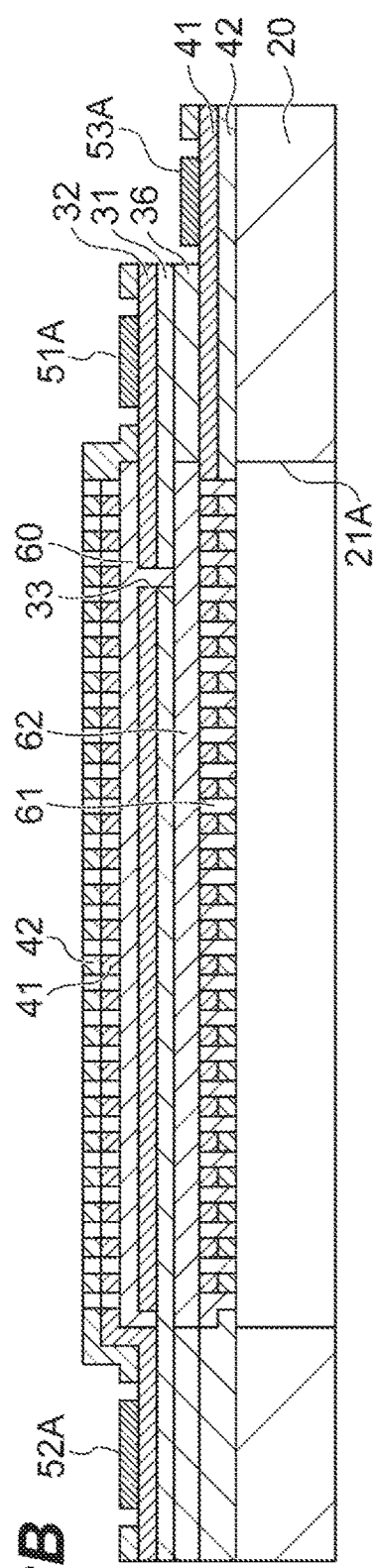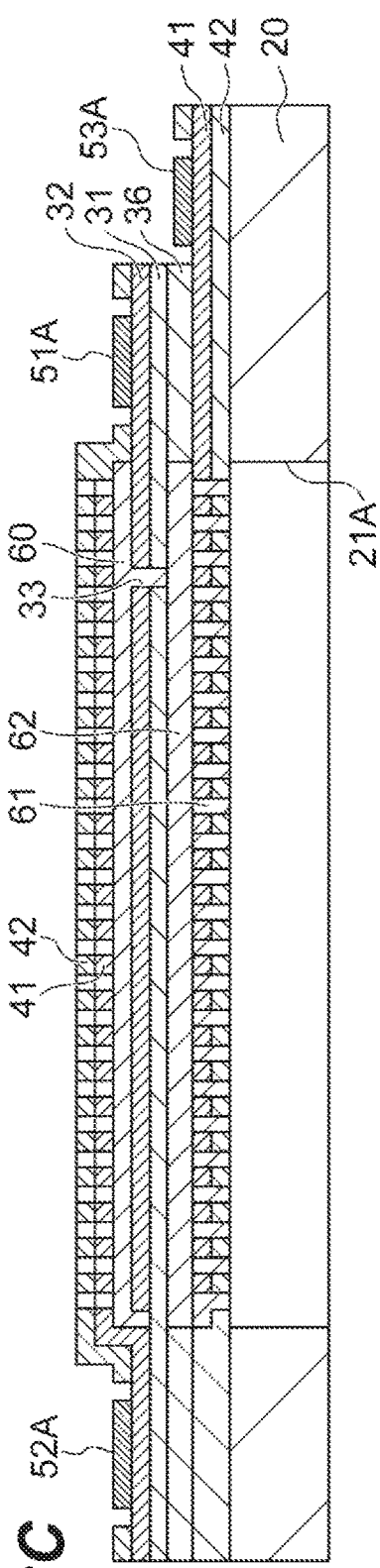

MEMS MICROPHONE

CROSS-REFERENCE TO RELATED APPLICATIONS

This application is based upon and claims the benefit of priority from Japanese Patent Application No. 2018-161720, filed on 30 Aug. 2018, the entire contents of which are incorporated herein by reference.

TECHNICAL FIELD

The present disclosure relates to a MEMS microphone.

BACKGROUND

In recent years, demand for an ultra-small microphone module including a MEMS microphone has increased. For example, Japanese Unexamined Patent Publication No. 2011-055087 (Patent Document 1), Japanese Unexamined Patent Publication No. 2015-502693 (Patent Document 2), and Japanese Unexamined Patent Publication No. 2007-295487 (Patent Document 3) disclose a MEMS microphone having a configuration in which a membrane and a back plate are disposed to face each other via an air gap on a silicon substrate. In such a MEMS microphone, a capacitor structure is formed of the membrane and the back plate. When a sound pressure is received and the membrane vibrates, capacitance in the capacitor structure changes. The change in capacitance is converted to an electrical signal and amplified in an ASIC chip.

SUMMARY

Incidentally, there is a limit to a frequency band with which the above-described MEMS microphone can cope. For example, in some cases, a sufficient S/N ratio cannot be obtained outside the frequency band. Therefore, a MEMS microphone having a wide frequency band is required.

According to the present disclosure, a MEMS microphone capable of suppressing a decrease in S/N ratio in a wide frequency range is provided.

A MEMS microphone according to an aspect of the present disclosure includes a substrate; and a first conversion portion and a second conversion portion provided on the substrate, the first conversion portion and the second conversion portion convert sound into an electrical signal, wherein the first conversion portion includes a first through hole penetrating the substrate; a first membrane covering the first through hole on one surface side of the substrate; and a first back plate covering the first through hole on the one surface side of the substrate, the first back plate faces the first membrane via a first air gap, the second conversion portion includes a second through hole penetrating the substrate; a second membrane covering the second through hole on the one surface side of the substrate; and a second back plate covering the second through hole on the one surface side of the substrate, the second back plate faces the second membrane via a second air gap, and an area of the second membrane is 1.1 times or more and 1.5 times or less an area of the first membrane when viewed in a thickness direction of the substrate.

This MEMS microphone includes the first conversion portion and the second conversion portion, and an area of the second membrane of the second conversion portion is 1.1 times or more and 1.5 times or less an area of the first membrane of the first conversion portion. In general, it is easy for a membrane having a relatively small area to obtain a good S/N ratio in a region on the high frequency side. On the other hand, it is easy for a membrane having a relatively large area to obtain a good S/N ratio in a region on the low frequency side. In the MEMS microphone, since the area of the first membrane of the first conversion portion is 1.1 times or more and 1.5 times or less the area of the second membrane of the second conversion portion, it is possible to suppress a decrease of the S/N ratio in a region on the low frequency side with the second conversion portion. Therefore, it is possible to achieve expansion of a frequency band of the MEMS microphone.

In the MEMS microphone according to another aspect, the first membrane and the second membrane may have a circular shape, and a diameter of the second membrane may be 1.1 times or more and 1.3 times or less a diameter of the first membrane. With this configuration, it is possible to suppress a decrease in an S/N ratio in a low frequency region with the second conversion portion. Therefore, it is possible to achieve expansion of a frequency band of the MEMS microphone.

In the MEMS microphone according to another aspect, the first membrane, the first back plate, the second membrane, and the second back plate may have a circular shape when viewed in the thickness direction of the substrate, and a ratio of the diameter of the first membrane to a diameter of the first back plate and a ratio of a diameter of the second membrane to a diameter of the second back plate may be 0.95 times or more and 1.10 times or less. With this configuration, it is possible to suppress occurrence of a frequency characteristic error in the first conversion portion and the second conversion portion.

In the MEMS microphone according to another aspect, a center of the first membrane and a center of the first back plate may be are substantially aligned with each other, or are shifted from each other by 5% or less of a diameter of one having a smaller diameter among the first membrane and the first back plate when viewed in the thickness direction of the substrate. With this configuration, capacitance between the first membrane and the first back plate is uniformized. Therefore, it is possible to achieve stabilization of sensitivity characteristics of the first conversion portion.

In the MEMS microphone according to another aspect, a center of the second membrane and a center of the second back plate are substantially aligned with each other, or are shifted from each other by 5% or less of a diameter of one having a smaller diameter among the second membrane and the second back plate when viewed in the thickness direction of the substrate. With this configuration, capacitance between the second membrane and the second back plate is uniformized. Therefore, it is possible to achieve stabilization of sensitivity characteristics of the second conversion portion.

BRIEF DESCRIPTION OF THE DRAWINGS

FIGS. 9A to 9C are diagrams illustrating respective steps when the MEMS microphone illustrated in FIG. 2 is manufactured.

FIG. 11 is a cross-sectional view illustrating a MEMS microphone according to a modification example.

FIGS. 12A to 12C are diagrams illustrating respective steps when the MEMS microphone illustrated in FIG. 11 is manufactured.

FIGS. 13A to 13C are diagrams illustrating respective steps when the MEMS microphone illustrated in FIG. 11 is manufactured.

DETAILED DESCRIPTION

Figure 1:
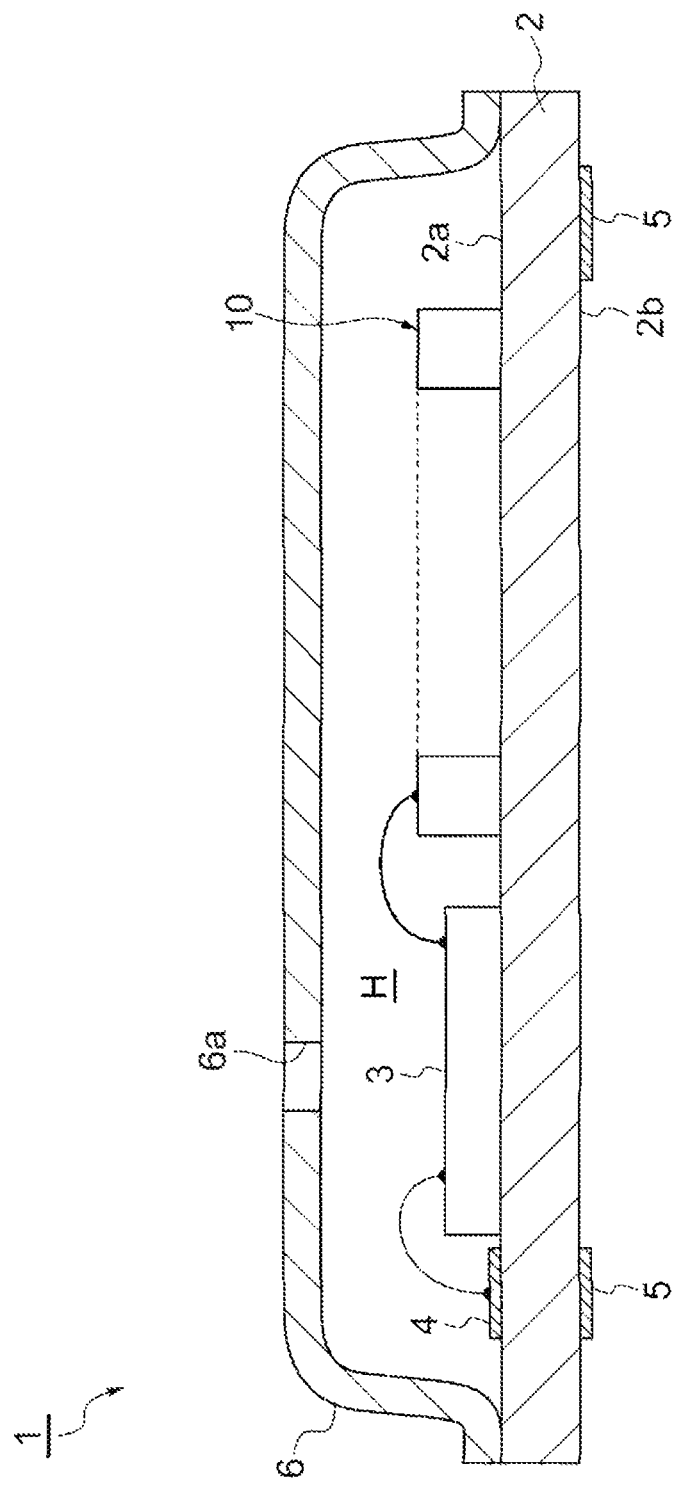
FIG. 1 is a schematic cross-sectional view illustrating a microphone module according to an embodiment.

Hereinafter, various embodiments will be described in detail with reference to the drawings. It should be noted that in the drawings, the same or corresponding portions are denoted by the same reference numerals and redundant description will be omitted.

As illustrated in FIG. 1, a microphone module 1 according to the embodiment includes at least a module substrate 2, a control circuit chip 3 (ASIC), a cap 6, and a MEMS microphone 10.

The module substrate 2 has a flat outer shape and is made of, for example, a ceramic material. The module substrate 2 may have a single-layer structure or a multi-layer structure including internal wirings. Terminal electrodes 4 and 5 are provided on one surface 2a and the other surface 2b of the module substrate 2, respectively, and the terminal electrodes 4 and 5 are connected to each other via a through conductor or internal wirings (not illustrated).

The cap 6 forms a hollow structure on the upper surface 20a side of the substrate 20 to be described below. Specifically, the cap 6 defines a cavity H between the cap 6 and the substrate 20, and the MEMS microphone 10 and the control circuit chip 3 are accommodated inside the cavity H. In the embodiment, the cap 6 is a metal cap made of a metal material. A sound hole 6a connecting the outside to the cavity H is provided in the cap 6.

Figure 2:
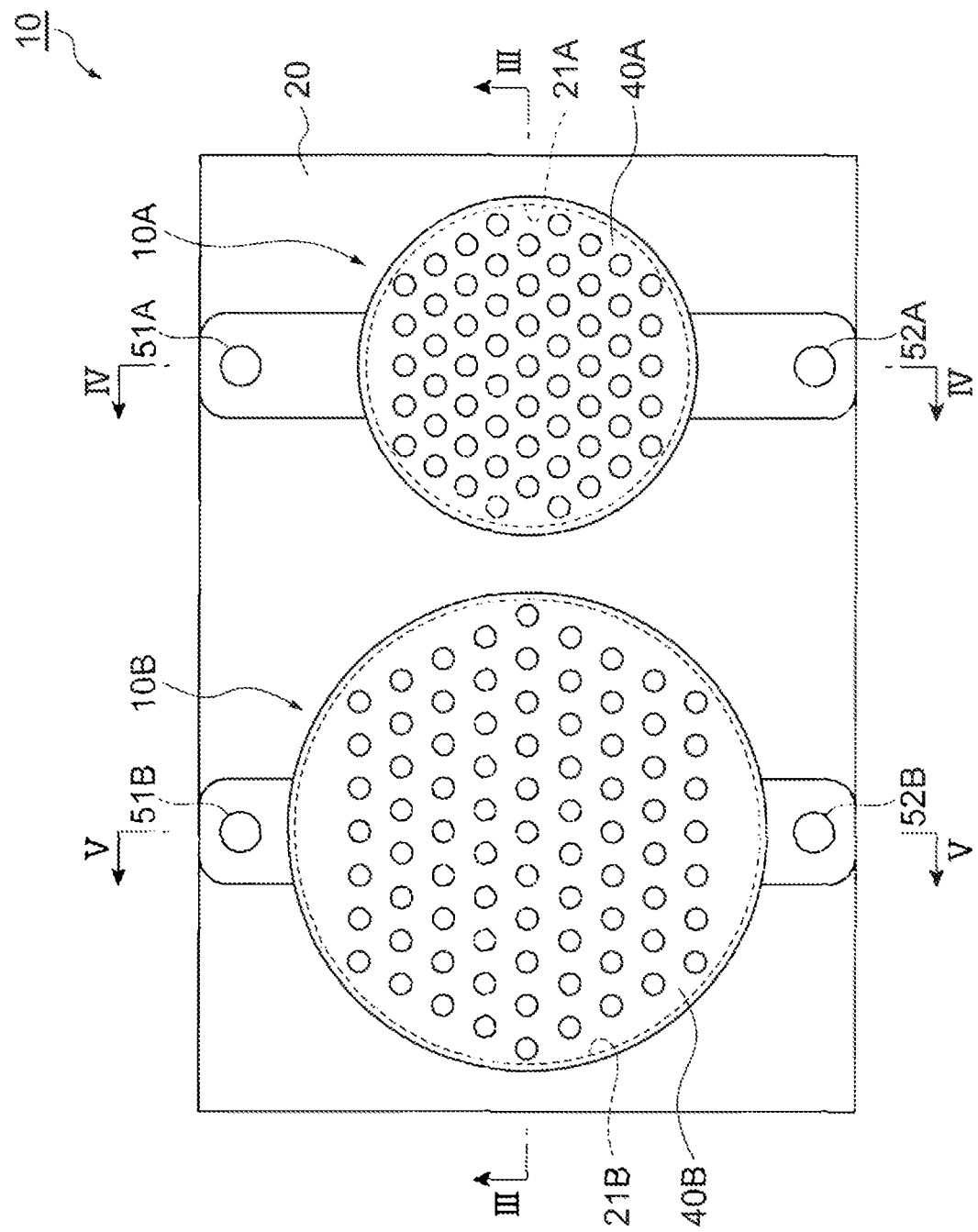
FIG. 2 is a plan view of the MEMS microphone illustrated in FIG. 1.
Figure 3:
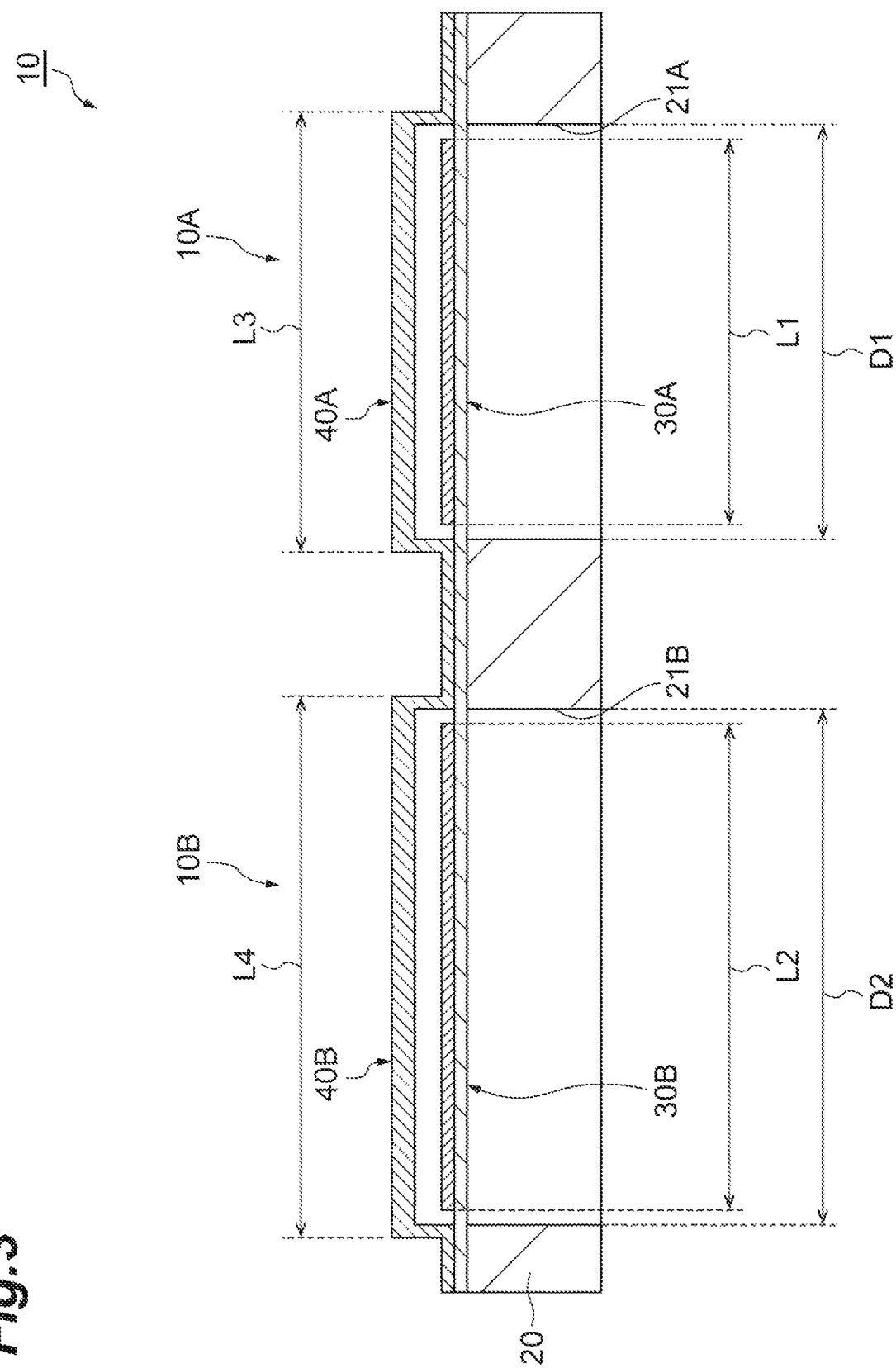
FIG. 3 is a cross-sectional view taken along a line III-III in FIG. 2.

The MEMS microphone 10 is mounted on the one surface 2a of the module substrate 2. The MEMS microphone 10 has a configuration in which a portion of the MEMS microphone 10 vibrates when the MEMS microphone 10 receives a sound pressure. As illustrated in FIGS. 2 and 3, the MEMS microphone 10 includes at least a first conversion portion 10A, a second conversion portion 10B, and a substrate 20.

The substrate 20 is made of, for example, Si or quartz glass ($SiO_2$). In the embodiment, the substrate 20 is made of glass which contains silicate as a main component and does not substantially contain an alkali metal oxide. The substrate 20 has a rectangular flat outer shape. A thickness of the substrate 20 is, for example, 500 µm. The substrate 20 can have a substantially rectangular shape (for example, 1500 µm×3000 µm) in a plan view, as illustrated in FIG. 2.

Figure 4:
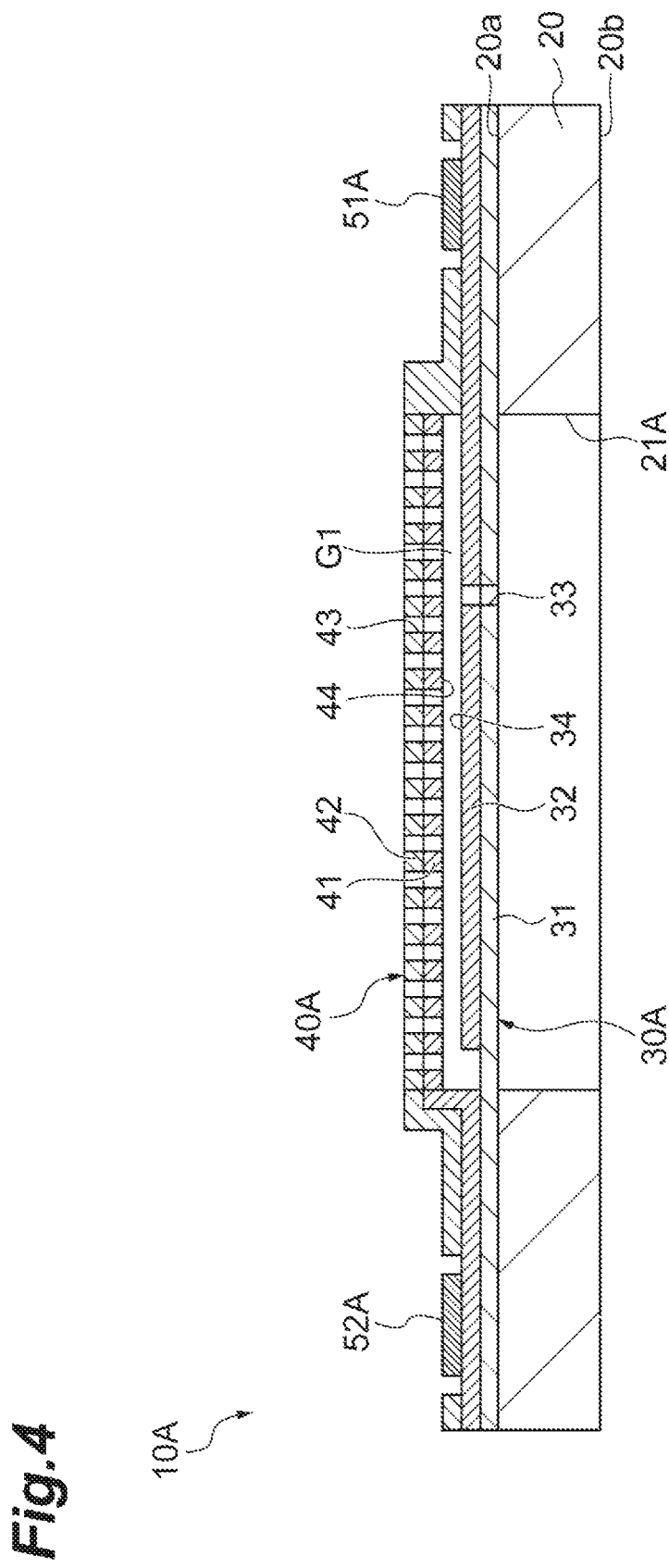
FIG. 4 is a cross-sectional view taken along a line IV-IV of FIG. 2.

As illustrated in FIG. 4, the first conversion portion 10A includes a first through hole 21A, a first membrane 30A, a first back plate 40A, and a pair of terminal portions 51A and 52A. The first through hole 21A has, for example, a true circular shape in plan view (that is, when viewed from a thickness direction of the substrate 20). A diameter D1 of the first through hole 21A is, for example, 1000 µm. The first membrane 30A is also referred to as a diaphragm and is a membrane that vibrates according to a sound pressure. The first membrane 30A is located on the upper surface 20a side that is one surface side of the substrate 20, and is directly laminated on the upper surface 20a. The first membrane 30A is provided to cover the entire first through hole 21A of the substrate 20.

The first membrane 30A has a multi-layer structure, and has a two-layer structure in the embodiment. A first layer 31 of the first membrane 30A located on the lower side is made of an insulator material (SiN in the embodiment). A thickness of the first layer 31 is, for example, 200 nm. The first layer 31 is provided on the upper surface 20a of the substrate 20 including the first through hole 21A. A second layer 32 of the first membrane 30A located on the upper side is made of a conductive material (Cr in the embodiment). A thickness of the second layer 32 is, for example, 100 nm. The second layer 32 is integrally provided in a region corresponding to the first through hole 21A of the substrate 20 and an edge region of the first through hole 21A, which is a region in which the one (the terminal portion 51A in the embodiment) of the pair of terminal portions 51A and 52A has been formed.

When the first through hole 21A of the substrate 20 is completely closed by the first membrane 30A, a pressure difference may occur between the upper side and the lower side of the first membrane 30A. In order to reduce such a pressure difference, a small through hole 33 is provided in the first membrane 30A in the embodiment. It should be noted that a plurality of through holes 33 may be provided in the first membrane 30A.

The first back plate 40A is located on the upper surface 20a side of the substrate 20 and is located on the upper side of the first membrane 30A. The first back plate 40A is provided to cover the entire first through hole 21A of the substrate 20, similar to the first membrane 30A. The first back plate 40A faces the first membrane 30A via a first air gap G1. More specifically, a facing surface 44 (a lower surface in FIG. 4) of the first back plate 40A faces a facing surface 34 (an upper surface in FIG. 4) of the first membrane 30A in a region in which the first through hole 21A of the substrate 20 has been formed.

The first back plate 40A has a multi-layer structure, and has a two-layer structure in the embodiment, similar to the first membrane 30A. A first layer 41 of the first back plate 40A located on the lower side is made of a conductive material (Cr in the embodiment). A thickness of the first layer 41 is, for example, 300 nm. A second layer 42 of the first back plate 40A located on the upper side is made of an insulator material (SiN in the embodiment). A thickness of the second layer 42 is, for example, 50 nm. The first layer 41 and the second layer 42 of the first back plate 40A are integrally provided in the region corresponding to the first through hole 21A of the substrate 20 and the edge region of the first through hole 21A, which is a region in which the other (the terminal portion 52A in the embodiment) of the pair of terminal portions 51A and 52A has been formed. The second layer 42 of the first back plate 40A is not provided in a region in which the pair of terminal portions 51A and 52A have been formed, and the second layer 32 of the first membrane 30A and the first layer 41 of the first back plate 40A are exposed in the region in which the pair of terminal portions 51A and 52A have been formed. The first back plate 40A includes a plurality of holes 43. The plurality of holes 43 may all have, for example, a true circular opening shape (see FIG. 2) and may be regularly disposed (staggered in the embodiment).

The pair of terminal portions 51A and 52A is made of a conductive material and is made of Cu in the embodiment. One terminal portion MA among the pair of terminal portions 51A and 52A is formed on the second layer 32 of the first membrane 30A provided in the edge region of the first through hole 21A, and the other terminal portion 52A is formed on the first layer 41 of the first back plate 40A provided in the edge region of the first through hole 21A.

In the first conversion portion 10A, the first membrane 30A includes the second layer 32 as a conductive layer, and the first back plate 40A includes the first layer 41 as a conductive layer, as described above. Therefore, in the first conversion portion 10A, a parallel flat plate type capacitor structure is formed of the first membrane 30A and the first back plate 40A. When the first membrane 30A vibrates according to a sound pressure, a width of the first air gap G1 between the first membrane 30A and the first back plate 40A changes and capacitance of the capacitor structure changes. The first conversion portion 10A is a capacitive conversion portion that outputs a change in capacitance from the pair of terminal portions 51A and 52A.

Figure 5:
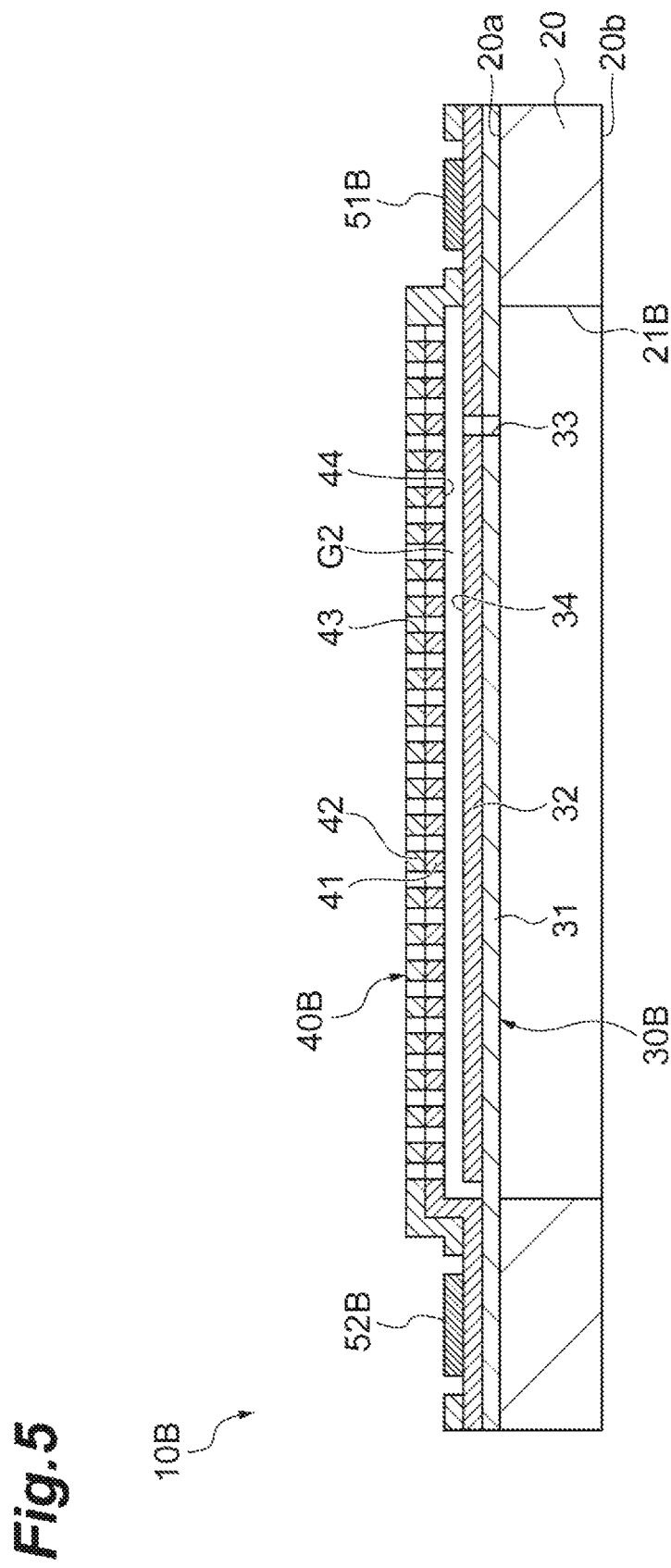
FIG. 5 is a cross-sectional view taken along a line VV of FIG. 2.

The second conversion portion 10B has substantially the same configuration as the first conversion portion 10A, as illustrated in FIG. 5. The second conversion portion 10B is provided on the same substrate 20 as that for the first conversion portion 10A. The second conversion portion 10B is disposed side by side next to the first conversion portions 10A. The second conversion portion 10B includes a second through hole 21B, a second membrane 30B, a second back plate 40B, and a pair of terminal portions 51B and 52B. The second through hole 21B has, for example, a true circular shape in plan view (that is, when viewed from a thickness direction of the substrate 20). A diameter D2 of the second through hole 21B is greater than the diameter D1 of the first through hole 21A and is, for example, 1300 μm. The second membrane 30B is a membrane that vibrates according to a sound pressure, similar to the first membrane 30A. The second membrane 30B is located on the upper surface 20a side that is one surface side of the substrate 20, and is directly laminated on the upper surface 20a. The second membrane 30B is provided to cover the entire second through hole 21B of the substrate 20.

The second membrane 30B has a multilayer structure, similar to the first membrane 30A. In the embodiment, the second membrane 30B has a two-layer structure including a first layer 31 and a second layer 32. A thickness of the second membrane 30B is substantially the same as that of the first membrane 30A and is, for example, 2000 nm. The second membrane 30B is provided on the upper surface 20a of the substrate 20 including the second through hole 21B. The second layer 32 of the second membrane 30B located on the upper side is made of a conductive material (Cr in the embodiment). A thickness of the second layer 32 is, for example, 100 nm. The second layer 32 is integrally provided in a region corresponding to the second through hole 21B of the substrate 20 and an edge region of the second through hole 21B, which is a region in which the one (the terminal portion 52B in the embodiment) of the pair of terminal portions 51B and 52B has been formed. In the second membrane 30B, a through hole 33B is provided to reduce a pressure difference between the upper side and the lower side of the second membrane 30B. It should be noted that a plurality of through holes 33 may be provided in the second membrane 30B.

The second back plate 40B is located on the upper surface 20a side of the substrate 20 and is located on the upper side of the second membrane 30B. The second back plate 40B is provided to cover the entire second through hole 21B of the substrate 20, similar to the second membrane 30B. The second back plate 40B faces the second membrane 30B via a second air gap G2. More specifically, a facing surface 44 (a lower surface in FIG. 5) of the second back plate 40B faces a facing surface 34 (an upper surface in FIG. 4) of the second membrane 30B in a region in which the second through hole 21B of the substrate 20 has been formed.

The second back plate 40B has a multi-layer structure, and has a two-layer structure in the embodiment, similar to the first back plate 40A. A first layer 41 of the second back plate 40B located on the lower side is made of a conductive material (Cr in the embodiment). A thickness of the first layer 41 is, for example, 300 nm. A second layer 42 of the second back plate 40B located on the upper side is made of an insulator material (SiN in the embodiment). A thickness of the second layer 42 is, for example, 50 nm. The first layer 41 and the second layer 42 of the second back plate 40B are integrally provided in a region corresponding to the second through hole 21B of the substrate 20 and an edge region of the second through hole 21B, which is a region in which the other (in the embodiment, the terminal portion 52B) of the pair of terminal portions 51B and 52B is formed. The second layer 42 of the second back plate 40B is not provided in the region in which the pair of terminal portions 51B and 52B is formed, and the second layer 32 of the second membrane 30B and the first layer 41 of the second back plate 40B are exposed in the region in which the pair of terminal portions 51B and 52B is formed. The second back plate includes a plurality of holes 43. The plurality of holes 43 may all have, for example, a true circular opening shape (see FIG. 2) and may be regularly disposed (staggered in the embodiment).

The pair of terminal portions 51B and 52B of the second conversion portion 10B is made of a conductive material and is made of Cu in the embodiment. One terminal portion 51B among the pair of terminal portions 51B and 52B is formed on the second layer 32 of the second membrane 30B provided in the edge region of the second through hole 21B, and the other terminal portion 52B is formed on the first layer 41 of the second back plate 40B provided in the edge region of the second through hole 21B.

In the second conversion portion 10B, a parallel flat plate type capacitor structure is formed of the second membrane 30B and the second back plate 40B, similar to the first conversion portion 10A. When the second membrane 30B vibrates according to a sound pressure, a width of the second air gap G2 between the second membrane 30B and the second back plate 40B changes and capacitance of the capacitor structure changes. The second conversion portion 10B is a capacitive conversion portion that outputs a change in capacitance from the pair of terminal portions 51B and 52B.

In the embodiment, an area of the second membrane 30B is 1.69 times an area of the first membrane 30A, and a diameter L2 of the second membrane 30B is 1.3 times a diameter L1 of the first membrane 30A, as illustrated in FIG. 2. Further, a center of the first membrane 30A and a center of the first back plate 40A are substantially aligned with each other. A center of the second membrane 30B and a center of the second back plate 40B are substantially aligned with each other.

The control circuit chip 3 is mounted on one surface 2a of the module substrate 2 to be close to the MEMS microphone 10. A change in capacitance in the MEMS microphone 10 is input to the control circuit chip 3. The control circuit chip 3 and the MEMS microphone 10 are electrically connected by, for example, wire bonding. The control circuit chip 3 is connected to the terminal electrode 4 provided on the one surface 2a of the module substrate 2, and a signal of the control circuit chip 3 is output to the outside through the terminal electrodes 4 and 5.

Figure 6:
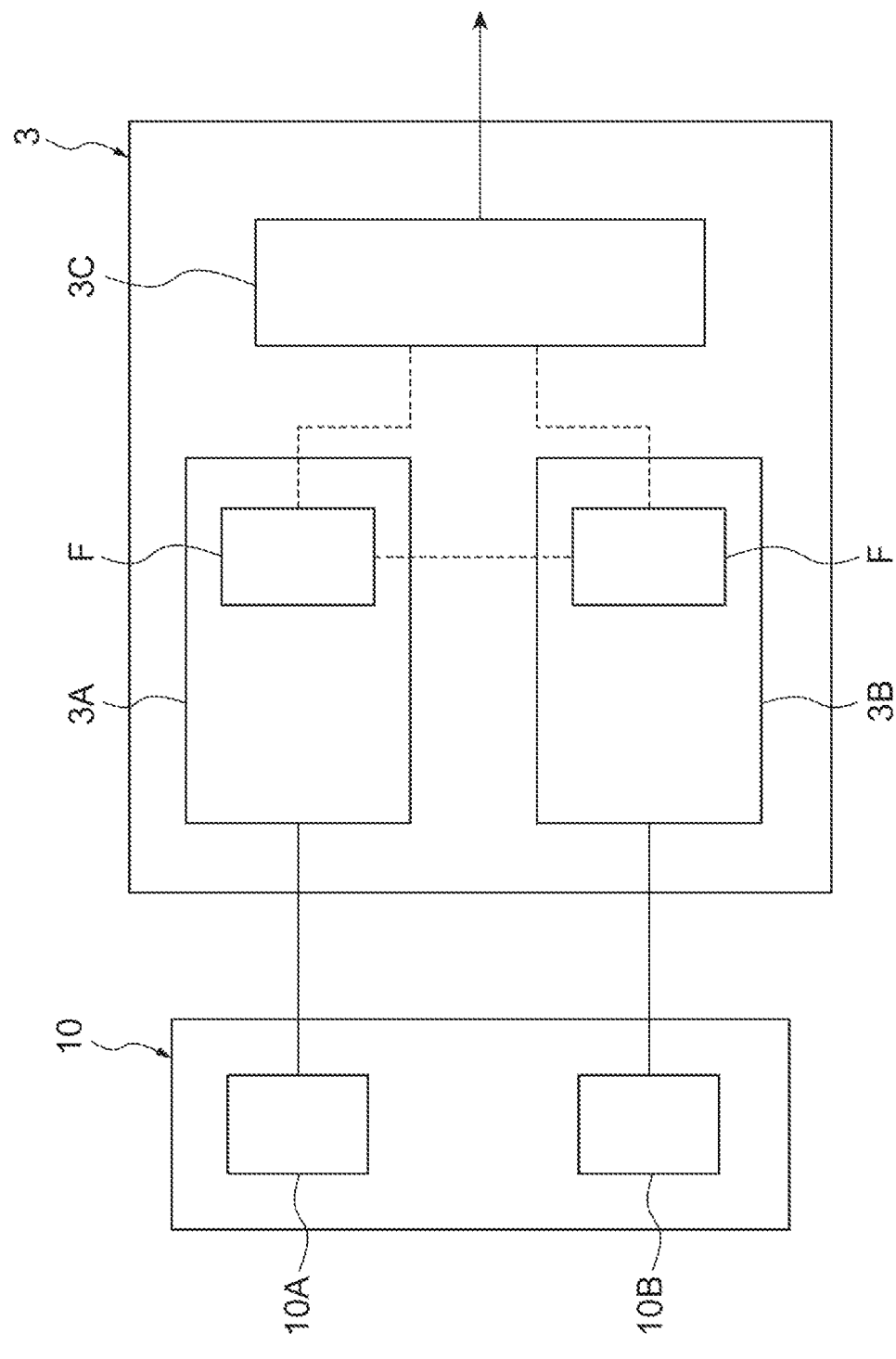
FIG. 6 is a block diagram of a microphone module illustrated in FIG. 1.

As illustrated in FIG. 6, the control circuit chip 3 includes a first control circuit 3A, a second control circuit 3B, and a mixer 3C. The first control circuit 3A is electrically connected to the first conversion portion 10A of the MEMS microphone 10. The second control circuit 3B is electrically connected to the second conversion portion 10B of the MEMS microphone 10. That is, the change in capacitance in the first conversion portion 10A is input to the first control circuit 3A, and the change in capacitance in the second conversion portion 10B is input to the second control circuit 3B. The first control circuit 3A has a function of converting the change in capacitance in the capacitor structure of the first conversion portion 10A into an analog or digital electric signal, and an amplification function. Similarly, the second control circuit 3B has a function of converting the change in capacitance in the capacitor structure of the second conversion portion 20B into an analog or digital electric signal, and an amplification function. The mixer 3C is connected to the first control circuit 3A and the second control circuit 3B. Outputs of the first control circuit 3A and the output of the second control circuit 3B are input to the mixer 3C. The mixer 3C combines the output of the first control circuit 3A and the output of the second control circuit 3B, and outputs an electrical signal as an output of the control circuit chip 3.

Next, a configuration of the first control circuit 3A will be described in more detail with reference to FIG. 7. Hereinafter, a case in which the first control circuit 3A converts the change in capacitance in the capacitor structure of the first conversion portion 10A into an analog electric signal will be described. It should be noted that since a configuration of the second control circuit 3B is the same as that of the first control circuit 3A, description thereof will be omitted.

Figure 7:
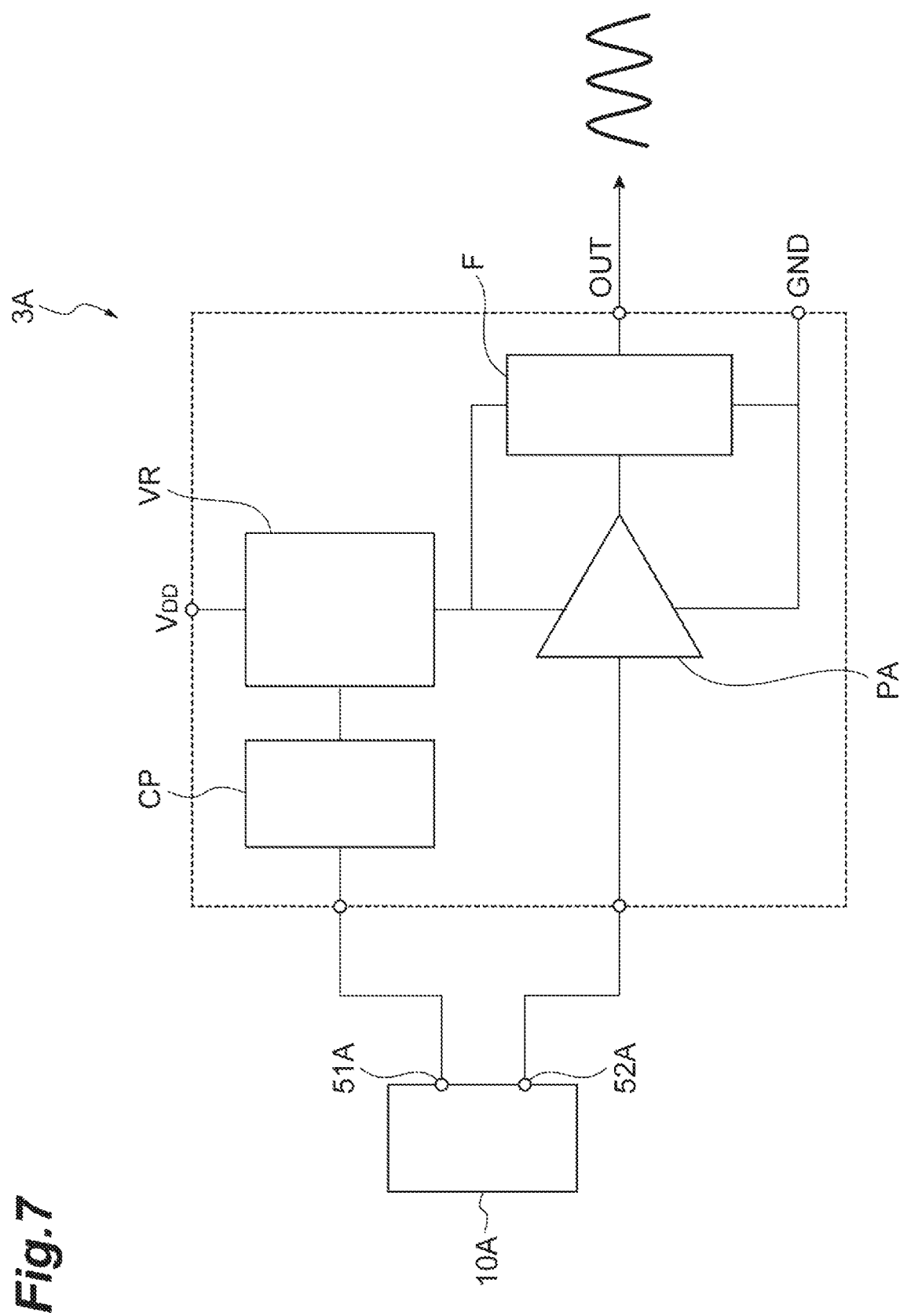
FIG. 7 is a diagram illustrating a configuration of a first control circuit of a control circuit chip illustrated in FIG. 6.

As illustrated in FIG. 7, the first control circuit 3A includes a boosting circuit CP, a reference voltage generation circuit VR, a preamplifier PA, and a filter F. The boosting circuit CP is connected to one terminal portion 51A of the first conversion portion 10A of the MEMS microphone 10, and is a circuit that supplies a bias voltage to the first conversion portion 10A. The reference voltage generation circuit VR is connected to the boosting circuit CP, and generates a reference voltage in the boosting circuit CP. Further, the reference voltage generation. circuit VR is also connected to the preamplifier PA and the filter F to supply a voltage. The preamplifier PA is connected to the other terminal portion 52A of the first conversion portion 10A, and is a circuit that performs impedance conversion and gain adjustment with respect to the change in capacitance in the capacitor structure of the first conversion portion 10A. The filter F is connected to a stage after the preamplifier PA. The filter F is a circuit that passes only a component in a predetermined frequency band of a signal from the preamplifier PA. Each of the first control circuit 3A and the second control circuit 3B has the filter F, and the filter F of the first control circuit 3A and the filter F of the second control circuit 3B are connected to each other (see FIG. 6).

It should be noted that when the first control circuit 3A converts the change in capacitance in the capacitor structure of the first conversion portion 10A into a digital electric signal, the first control circuit 3A further includes a modulator between the preamplifier PA and the filter F. This modulator converts an analog signal from the preamplifier PA into a pulse density modulation (PDM) signal.

The control circuit chip 3 performs switching between the first conversion portion 10A and the second conversion portion 10B according to a frequency of a sound wave detected by the MEMS microphone 10. Specifically, when the frequency of the sound wave is equal to or higher than a predetermined threshold value, the control circuit chip 3 outputs a signal based on the change in capacitance in the first conversion portion 10A (that is, a signal output from the first control circuit 3A). When the frequency of the sound wave is lower than the predetermined threshold value, the control circuit chip 3 outputs a signal based on the change in capacitance in the second conversion portion 10B (that is, a signal output from the second control circuit 3B). As an example, the threshold value of the frequency in the control circuit chip 3 can be a value in the range of 500 Hz or more and 1000 Hz or less. It should be noted that the threshold value may be appropriately set according to the dimension of the first membrane 30A of the first conversion portion 10A and the dimension of the second membrane 30B of the second conversion portion 10B.

It should be noted that the control circuit chip 3 may perform the switching on the basis of two threshold values (a first threshold value on the high frequency side and a second threshold value on the low frequency side) for the frequency of the sound wave. For example, when the frequency of the sound wave is equal to or high than the first threshold value on the high frequency side, the control circuit chip 3 outputs a signal based on the change in capacitance in the first conversion portion 10A (that is, the signal output from the first control circuit 3A). When the frequency of the sound wave is lower than the first threshold value and higher than the second threshold value on the low frequency side, the control circuit chip 3 combines the signal based on the change in capacitance in the first conversion portion 10A with the signal based on the change in capacitance in the second conversion portion 10B using the mixer 3C and outputs a resultant signal. When the frequency of the sound wave is equal to or lower than the second threshold value, the control circuit chip 3 outputs a signal based on the change in capacitance in the second conversion portion 10B (that is, the signal output from the second control circuit 3B).

Next, a procedure for manufacturing the above-described MEMS microphone 10 will be described with reference to FIGS. 8A to 8C and 9A to 9C. It should be noted that since the first conversion portion 10A and the second conversion portion 10B have substantially the same structure, and are formed together by the same steps. Therefore, only cross-sections in the first conversion portion 10A is shown in FIGS. 8A to 8C and 9A to 9C.

Figure 8A:
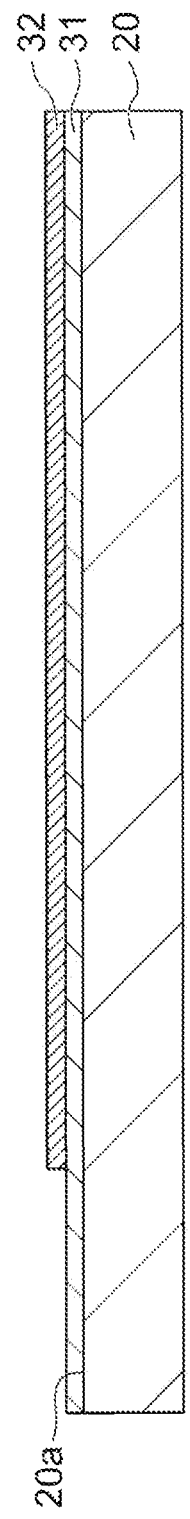
FIGS. 8A to 8C are diagrams illustrating respective steps when the MEMS microphone illustrated in FIG. 2 is manufactured.

When the MEMS microphone 10 is manufactured, the first layer 31 and the second layer 32 of the first membrane 30A are first sequentially formed on the upper surface 20a of the flat substrate 20 in which the first through hole 21A is not formed, as illustrated in FIG. 8A. The first layer 31 can be formed using CVD of an insulating material (SiN in the embodiment). The second layer 32 is formed using sputtering of a conductive material (Cr in the embodiment). The first layer 31 and the second layer 32 can be patterned using photoresist and RIE (not illustrated).

Figure 8B:
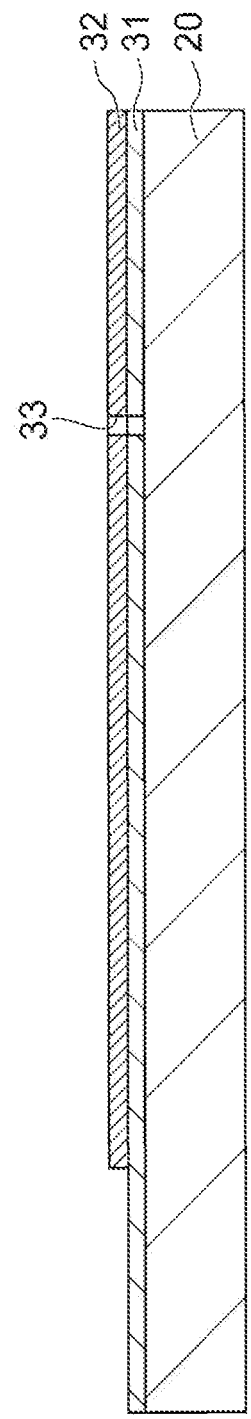
Figure 8C:
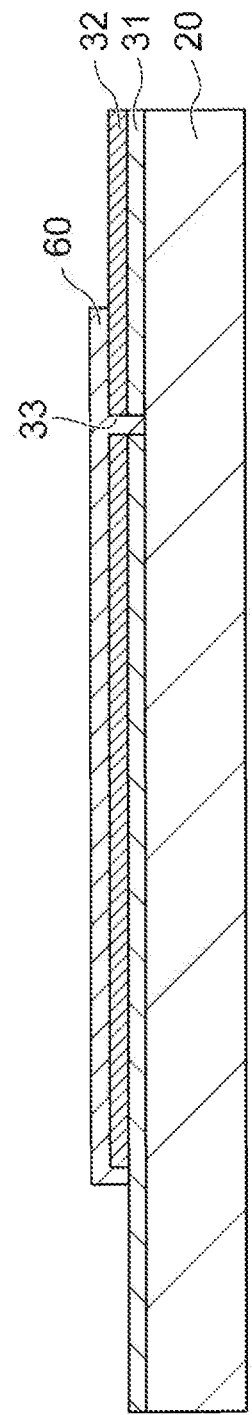

Then, the through hole 33 is provided in the first membrane 30A, as illustrated in FIG. 8B. The through hole 33 can be formed, for example, using RIE using photoresist having an opening in a region of the through hole 33. A type of gas used for RIE is appropriately selected according to a material of a layer constituting the first membrane 30A.

Further, a sacrificial layer 60 is formed in a region serving as the first air gap G1 described above, as illustrated in FIG. 8C. The sacrificial layer 60 is formed, for example, using CVD of $SiO_2$. A thickness of the sacrificial layer 60 is, for example, 2 µm. The sacrificial layer 60 can be patterned using photoresist and RIE (not illustrated).

Next, the first layer 41 and the second layer 42 of the first back plate 40A are sequentially deposited, as illustrated in FIG. 9A. The first layer 41 is formed using sputtering of a conductive material (Cr in the embodiment). The second layer 42 is formed using CVD of an insulator material (SiN in the embodiment). The first layer 41 and the second layer 42 can be patterned using photoresist and RIE (not illustrated).

Further, the pair of terminal portions 51A and 52A are formed, as illustrated in FIG. 9B. Specifically, the terminal portion 51A is formed on the second layer 32 of the first membrane 30A, and the terminal portion 52A is formed on the first layer 41 of the first back plate 40A. The terminal portions 51A and 52A are formed using sputtering of a conductive material (Cu in the embodiment). The terminal portions 51A and 52A can be patterned using photoresist and RIE (not illustrated).

Further, as illustrated in FIG. 9C, the first through hole 21A is formed in the substrate 20 by etching. The first through hole 21A are formed by wet etching using buffered hydrofluoric acid (BHF). The first through hole 21A can also be formed by dry etching using a vapor of hydrogen fluoride (HF). At the time of etching, the entire upper surface 20a of the substrate 20 and the lower surface 20b other than a region in which the first through hole 21A are formed are covered with photoresist or the like. In addition, an SiN layer having a thickness of about 50 nm may be formed on the upper surface 20a (on the lower side of the first membrane) of the substrate 20 as an etching stopper film. After the first through hole 21A is formed, a portion of the SiN layer exposed from the first through hole 21A may be removed by etching.

The sacrificial layer 60 is removed by etching. The sacrificial layer 60 is removed by wet etching using buffered hydrofluoric acid (BHF). The sacrificial layer 60 can also be removed by dry etching using vapor of hydrogen fluoride (HF). At the time of etching, the upper surface 20a of the substrate 20 other than the region in which the sacrificial layer 60 is formed and the entire lower surface 20b are covered with photoresist or the like. The MEMS microphone 10 described above is manufactured by the above-described procedure.

As described above, the MEMS microphone 10 includes the first conversion portion 10A and the second conversion portion 10B, and an area of the second membrane 30B of the second conversion portion 10B is 1.21 times or more and 2.25 times or less an area of the first membrane 30A of the first conversion portion 10A. In general, it is easy for a membrane having a relatively small area to follow sound waves on the high frequency side, but difficult to follow sound waves on the low frequency side. Therefore, it is easy for a decrease in the S/N ratio to occur in a region on the low frequency side, but it is difficult for a decrease in the S/N ratio to occur in a region on the high frequency side. On the other hand, it is difficult for a membrane having a relatively large area to follow sound waves on the high frequency side, but easy to follow sound waves on the low frequency side. Therefore, it is difficult for a decrease in the S/N ratio to occur in a region on the low frequency side, but it is easy for a decrease in the S/N ratio to occur in a region on the high frequency side.

Figure 10:
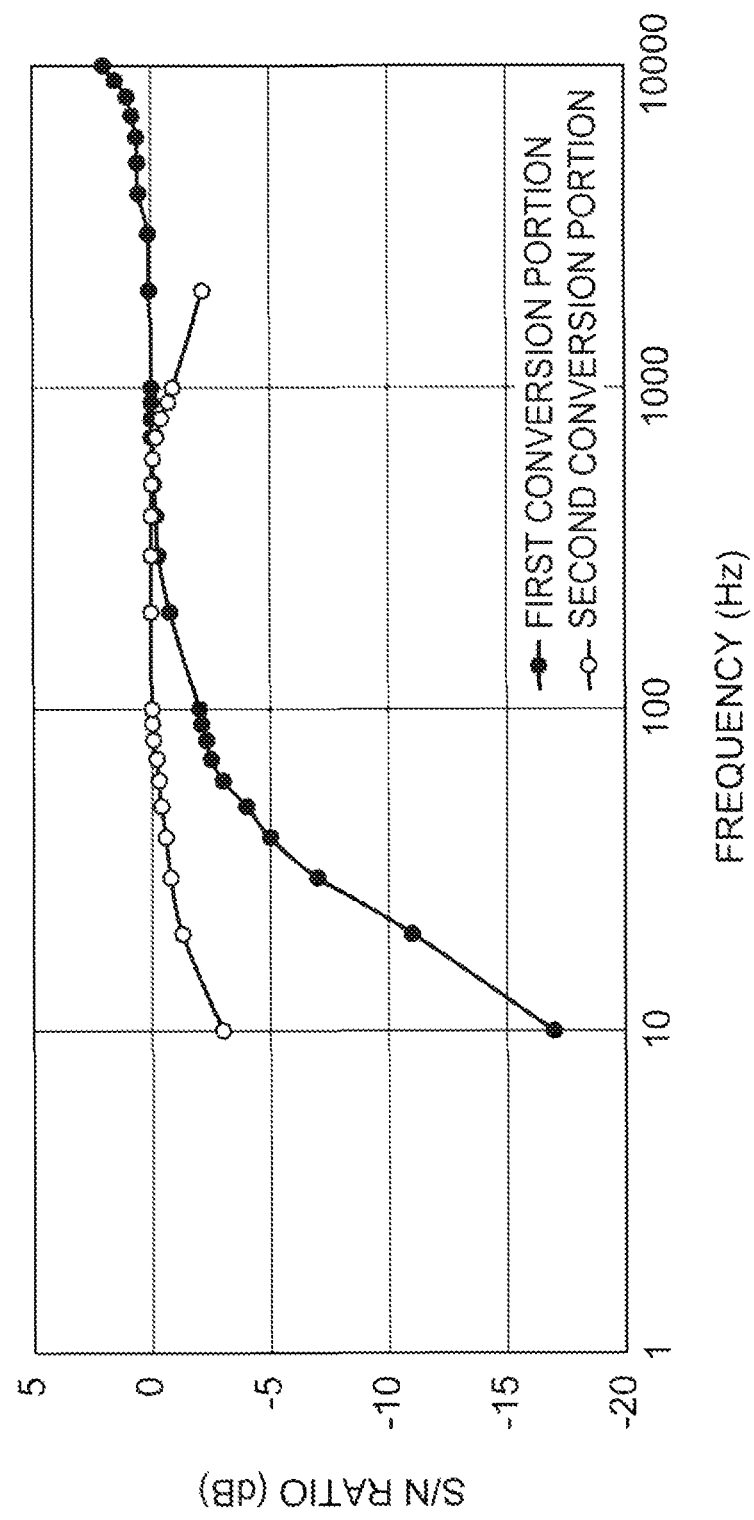
FIG. 10 is a graph illustrating frequency characteristics of the MEMS microphone illustrated in FIG. 2.

FIG. 10 is a graph illustrating a relationship between a frequency and an S/N ratio in the first conversion portion 10A and the second conversion portion 10B of the MEMS microphone 10. A vertical axis in FIG. 10 indicates a difference from an S/N ratio (−40 dB) of the first conversion portion 10A at a frequency of 1000 Hz, which serves a reference. As illustrated in FIG. 10, the S/N ratio of the first conversion portion 10A is good in a region in which the frequency of the sound wave is 1000 Hz or more, and the S/N ratio of the second conversion portion 10B is good in a region in which the frequency of the sound wave is 100 Hz or less. Therefore, it is possible to obtain a good S/N ratio in a wide frequency band, for example, by setting a threshold value for switching between the first conversion portion 10A and the second conversion portion 10B in a frequency band in which frequency characteristics of the first conversion portion 10A crosses frequency characteristics of the second conversion portion 10B.

Thus, in the MEMS microphone 10, since the area of the second membrane 30B of the second conversion portion 10B is 1.21 times or more and 2.25 times or less the area of the first membrane 30A of the first conversion portion 10A, it is possible to suppress a decrease in the S/N ratio in the region on the low frequency side with the second conversion portion 10B. Therefore, it is possible to achieve expansion of the frequency band of the MEMS microphone 10.

Further, in the MEMS microphone 10, the first membrane 30A and the second membrane 30B are circular (see FIG. 2), and the diameter L2 of the second membrane 30B is 1.1 times or more and 1.3 times or less the diameter L1 of the first membrane 30A. Accordingly, it is possible to suppress the decrease in the S/N ratio in the low frequency region with the second conversion portion 10B. Therefore, it is possible to achieve expansion of the frequency band of the MEMS microphone 10.

Further, in the MEMS microphone 10, the first membrane 30A, the first back plate 40A, the second membrane 30B, and the second back plate 40B have a circular shape when viewed in a thickness direction of the substrate 20, and a ratio of the diameter L1 of the first membrane 30A to a diameter L3 of the first back plate 40A and a ratio of the diameter L2 of the second membrane 30B to a diameter L4 of the second back plate 40B are 0.95 times or more and 1.10 times or less. Since frequency characteristics of each conversion portion are correlated with the diameter of each back plate, it is possible to suppress occurrence of frequency characteristics shift in the first conversion portion and the second conversion portion. It should be noted that the ratio of the diameter L1 of the first membrane 30A to the diameter L3 of the first back plate 40A and the ratio of the diameter L2 of the second membrane 30B to the diameter L4 of the second back plate 40B may be the same as or different from each other.

Further, in the MEMS microphone 10, the center of the first membrane 30A and the center of the first back plate 40A are substantially aligned with each other, when viewed in the thickness direction of the substrate 20. When a shift between the center of the first membrane 30A and the center of the first back plate 40A in the first conversion portion 10A occurs, a facing area between the first membrane 30A and the first back plate 40A decreases. As a result, an amount of change in the capacitance of the first conversion portion 10A with respect to the sound pressure is decreased, and a sensitivity is degraded. On the other hand, the capacitance between the first membrane 30A and the first back plate 40A is maximized and uniformized since the center of the first membrane 30A and the center of the first back plate 40A are substantially aligned with each other. Therefore, it is possible to achieve stabilization of the sensitivity characteristics of the first conversion portion 10A.

It should be noted that the center of the membrane and the center of the back plate may be shifted from each other by 5% or less of a diameter of one having a smaller diameter among the membrane and the back plate.

Further, in the MEMS microphone 10, the center of the second membrane 30B and the center of the second back plate 40B are substantially aligned with each other, when viewed in the thickness direction of the substrate 20. When a shift between the center of the second membrane 30B and the center of the second back plate 40B in the second conversion portion 10B occurs, a facing area between the second membrane 30B and the second back plate 40B decreases. As a result, an amount of change in the capacitance of the second conversion portion 10B with respect to the sound pressure is decreased, and a sensitivity is degraded. On the other hand, the capacitance between the second membrane 30B and the second back plate 40B is maximized and uniformized since the center of the second membrane 30B and the center of the second back plate 40B are substantially aligned with each other. Therefore, it is possible to achieve stabilization of the sensitivity characteristics of the second conversion portion 10B.

Further, in the MEMS microphone 10, the substrate 20 made of glass is used as a substrate. The substrate 20 made of glass includes a higher insulation resistance than a semiconductor substrate such as a silicon substrate. That is, in the MEMS microphone 10, high insulation is realized by the substrate 20 made of glass.

Here, a silicon substrate that is inferior in insulation to the substrate 20 made of glass can be regarded as an incomplete nonconductor, and unintended stray capacitance can be generated between the conductor layers (the second layer 32 of the first membrane 30A and the second membrane 30B, the first layer 41 of the first back plate 40A and the second back plate 40B, and the terminal portions 51A, 52A, 51B, and 52B) formed on the substrate. Further, even when an insulating thin film (a silicon oxide thin film in the case of a silicon substrate) is provided between the silicon substrate and the conductor layer to enhance insulation of the substrate, stray capacitance can be generated in the insulating thin film. Therefore, in a case in which a silicon substrate is used, terminals are additionally provided in the silicon substrate, and it is necessary to perform potential adjustment between the silicon substrate and the conductive layer using an ASIC.

On the other hand, in the substrate 20 made of glass having high insulation resistance, generation of such stray capacitance is effectively suppressed. Therefore, according to the MEMS microphone 10, it is possible to reduce the stray capacitance by using the substrate 20 made of glass and to suppress noise due to the stray capacitance. Further, according to the MEMS microphone 10, it is not necessary for an insulating thin film to be provided between the substrate 20 and the conductor layer. Further, according to the MEMS microphone 10, it is not necessary to perform the potential adjustment by using the substrate 20 made of glass, and it is possible to simplify signal processing or a circuit design in an ASIC as compared with a case in which a silicon substrate is used.

Although the example in which each of the first conversion portion 10A and the second conversion portion 10B includes one back plate (the first back plate 40A or the second back plate 40B) has been described in the embodiment described above, each of the first conversion portion 10A and the second conversion portion 10B may include two back plates. Hereinafter, a MEMS microphone 10' according to a modification example will be described with reference to FIG. 11. It should be noted that in the MEMS microphone 10' according to the modification example, since a first conversion portion 10A and a second conversion portion 10B have substantially the same structure, only a cross-section of the first conversion portion 10A is illustrated in FIG. 11.

As illustrated in FIG. 11, in the MEMS microphone 10', the first conversion portion 10A includes a first back plate 40A, a first membrane 30A, and a rear back plate 40C. The first back plate 40A and the first membrane 30A in the first conversion portion 10A of the MEMS microphone 10' have the same configuration and positional relationship as those of the first back plate 40A and the first membrane 30A in the first conversion portion 10A of the MEMS microphone 10 described above. The MEMS microphone 10' is different from the MEMS microphone 10 mainly in that a rear back plate 40C is interposed between the substrate 20 and the first membrane 30A. The rear back plate 40C has a layer structure obtained by turning the first back plate 40A upside down. That is, in the rear back plate 40C, a second layer 42 located on the lower side is made of an insulator material (SiN in the embodiment), and a first layer 41 located on the upper side is made of a conductive material (Cr in the embodiment). A terminal portion 53A is formed on the first layer 41 of the rear back plate 40C.

In the first conversion portion 10A of the MEMS microphone 10', the first membrane 30A faces the first back plate 40A via a first air gap G1, and faces the rear back plate 40C via a rear air gap G3.

In the first conversion portion 10A of the MEMS microphone 10', two parallel flat plate capacitor structures are formed of the first membrane 30A and the two back plates (the first back plate 40A and the rear back plate 40C). When the first membrane 30A vibrates according to a sound pressure, a width of the first air gap G1 between the first membrane 30A and the first back plate 40A changes, and a width of the rear air gap G3 between the first membrane 30A and the rear back plate 40C also changes. In the first conversion portion 10A of the MEMS microphone 10', a change in capacitance of the capacitor structure according to the change in the widths of the first air gap G1 and the rear air gap G3 is output from three terminal portions 51A, 52A, and 53A. Accordingly, in the MEMS microphone 10', it is possible to realize a high S/N ratio as compared to the MEMS microphone 10 described above.

Further, in the MEMS microphone 10', an area of a second membrane 30B (not illustrated) of the second conversion portion 10B is 1.21 times or more and 2.25 times or less of an area of the first membrane 30A of the first conversion portion 10A, similar to the MEMS microphone 10. Therefore, in the MEMS microphone 10', it is possible to obtain the same effects as the above-described effects of the MEMS microphone 10.

Next, a procedure for manufacturing the MEMS microphone 10' will be described with reference to FIGS. 12A to 12C and 13A to 13C. It should be noted that only a cross-section of the first conversion portion 10A is illustrated, and the second conversion portion 10B is omitted in FIGS. 12A to 12C and FIGS. 13A to 13C.

When the MEMS microphone 10' is manufactured, the second layer 42 and the first layer 41 of the rear back plate 40C are first sequentially formed on the upper surface 20a of the substrate 20 having a flat shape in which the first through hole 21A is not formed, as illustrated in FIG. 12A.

The first layer 41 is formed using sputtering of a conductive material (Cr in the embodiment). The second layer 42 is formed using CVD of an insulator material (SiN in the embodiment). The first layer 41 and the second layer 42 can be patterned using photoresist and RIE (not illustrated). It should be noted that, for surface planarization, an insulator film 35 is formed in a remaining region of the region in which the rear back plate 40C has been formed. The insulator film 35 is formed using CVD of an insulator material (SiN in the embodiment). The insulator film 35 can also be patterned using photoresist and RIE (not illustrated).

Next, each hole 43 of the rear back plate 40C is filled with the insulator 61 ($SiO_2$ in the embodiment), as illustrated in FIG. 12B. The insulator 61 can be obtained by polishing a surface using CMP after $SiO_2$ is deposited using CVD.

Further, a sacrificial layer 62 is formed in a region serving as the rear air gap G3 described above, as illustrated in FIG. 12C. The sacrificial layer 62 is formed, for example, using CVD of $SiO_2$. A thickness of the sacrificial layer 62 is, for example, 3 μm. The sacrificial layer 62 can be patterned using photoresist and RIE (not illustrated). It should be noted that, for surface planarization, an insulator film 36 is formed in a remaining region of the region in which the sacrificial layer 62 has been formed. The insulator film 36 is formed using CVD of an insulator material (SiN in the embodiment). The insulator film 36 can also be patterned using photoresist and RIE (not illustrated). After the sacrificial layer 62 and the insulator film 36 are formed, a surface can be polished using CMP for surface planarization of the sacrificial layer 62 and the insulator film 36.

A first membrane 30A and a first back plate 40A are formed on the sacrificial layer 62 and the insulator film 36, similar to the first membrane 30A and the first back plate 40A of the MEMS microphone 10. After the first membrane 30A and the first back plate 40A are formed, the second layer 32 of the first membrane 30A, the first layer 41 of the first back plate 40A, and the first layer 41 of the rear back plate 40C in the region in which the terminal portions 51A, 52A, and 53A are formed are exposed, as illustrated in FIG. 13A.

The terminal portions 51A, 52A, and 53A are formed, as illustrated in FIG. 13B. Specifically, the terminal portion 51A is formed on the second layer 32 of the first membrane 30A, and the terminal portions 52A and 53A are formed on the first layer 41 of the first back plate 40A and the rear back plate 40C. The terminal portion 53A is formed using sputtering of a conductive material (Cu in the embodiment), similar to the terminal portions 51A and 52A. The terminal portions 51A, 52A, and 53A can be patterned using photoresist and RIE (not illustrated).

Further, the first through hole 21A is formed in the substrate 20 by etching, and the sacrificial layers 60 and 62 and the insulator 61 are removed by etching, as illustrated in FIG. 13C. The sacrificial layers 60 and 62 and the insulator 61 can be removed by wet etching using buffered hydrofluoric acid (BHF) or dry etching using a vapor of hydrogen fluoride (HF). The MEMS microphone 10' according to the modification example is manufactured through the procedure described above.

Although the embodiment of the present disclosure has been described above, the present disclosure is not limited to the embodiments, and various modification examples can be made. For example, the membrane may have a single layer structure of a conductor layer rather than a multilayer structure. The back plate may have a single-layer structure of a conductor layer rather than the multi-layer structure. In addition, a stacking order of a conductor layer and a non-conductor layer in the membrane and the back plate can be appropriately changed according to characteristics required for the MEMS microphone.

A conductor material constituting the conductor layer of the membrane and the back plate is not limited to a metal material, and may be another conductive material (for example, phosphorus-doped amorphous silicon).

Although a planar shape of the membrane, the back plate, and the through hole is a circular shape in the above embodiment, the planar shape of the membrane, the back plate, and the through hole may be a polygonal shape or may be a rounded square shape.

In order to prevent a phenomenon (so-called sticking) in which the membrane and the back plate are in contact with and are not separated from each other, a protrusion extending to the membrane may be provided on the facing surface side of the back plate.

What is claimed is:

1. A MEMS microphone comprising:
   a substrate; and
   a first conversion portion and a second conversion portion provided on the substrate, the first conversion portion and a second conversion portion convert sound into an electrical signal,
   wherein the first conversion portion includes
   a first through hole penetrating the substrate;
   a first membrane covering the first through hole on one surface side of the substrate; and
   a first back plate covering the first through hole on the one surface side of the substrate, the first back plate faces the first membrane via a first air gap,
   wherein the second conversion portion includes
   a second through hole penetrating the substrate;
   a second membrane covering the second through hole on the one surface side of the substrate; and
   a second back plate covering the second through hole on the one surface side of the substrate, the second back plate faces the second membrane via a second air gap, and
   an area of the second membrane is 1.21 times or more and 2.25 times or less an area of the first membrane when viewed in a thickness direction of the substrate.

2. The MEMS microphone according to claim 1, wherein the first membrane and the second membrane have a circular shape, and a diameter of the second membrane is 1.1 times or more and 1.3 times or less a diameter of the first membrane.

3. The MEMS microphone according to claim 2,
   wherein the first membrane, the first back plate, the second membrane, and the second back plate have a circular shape when viewed in the thickness direction of the substrate, and
   a ratio of the diameter of the first membrane to a diameter of the first back plate and a ratio of a diameter of the second membrane to a diameter of the second back plate are 0.95 times or more and 1.10 times or less.

4. The MEMS microphone according to claim 3, wherein a center of the first membrane and a center of the first back plate are substantially aligned with each other, or are shifted from each other by 5% or less of a diameter of one having a smaller diameter among the first membrane and the first back plate when viewed in the thickness direction of the substrate.

5. The MEMS microphone according to claim 4, wherein a center of the second membrane and a center of the second back plate are substantially aligned with each other, or are shifted from each other by 5% or less of a diameter of one having a smaller diameter among the second membrane and the second back plate when viewed in the thickness direction of the substrate.

6. The MEMS microphone according to claim 3, wherein a center of the second membrane and a center of the second back plate are substantially aligned with each other, or are shifted from each other by 5% or less of a diameter of one having a smaller diameter among the second membrane and the second back plate when viewed in the thickness direction of the substrate.

7. The MEMS microphone according to claim 1,
wherein the first membrane, the first back plate, the second membrane, and the second back plate have a circular shape when viewed in the thickness direction of the substrate, and
a ratio of a diameter of the first membrane to a diameter of the first back plate and a ratio of a diameter of the second membrane to a diameter of the second back plate are 0.95 times or more and 1.10 times or less.

8. The MEMS microphone according to claim 7, wherein a center of the first membrane and a center of the first back plate are substantially aligned with each other, or are shifted from each other by 5% or less of a diameter of one having a smaller diameter among the first membrane and the first back plate when viewed in the thickness direction of the substrate.

9. The MEMS microphone according to claim 8, wherein a center of the second membrane and a center of the second back plate are substantially aligned with each other, or are shifted from each other by 5% or less of a diameter of one having a smaller diameter among the second membrane and the second back plate when viewed in the thickness direction of the substrate.

10. The MEMS microphone according to claim 7, wherein a center of the second membrane and a center of the second back plate are substantially aligned with each other, or axe shifted from each other by 5% or less of a diameter of one having a smaller diameter among the second membrane and the second back plate when viewed in the thickness direction of the substrate.

\* \* \* \* \*